United States Patent Office 3,538,125
Patented Nov. 3, 1970

3,538,125

PHOTOSENSITIZER

Walter H. Kornfeld, Scottsdale, Ariz., and Riley M. Sinder, Venice, Calif., assignors to Motorola, Inc., Franklin Park, Ill., a corporation of Illinois No Drawing. Filed Nov. 13, 1967, Ser. No. 682,504
Int. Cl. C07d *109/00*
U.S. Cl. 260—349 2 Claims

ABSTRACT OF THE DISCLOSURE

A new sensitizer for use in the preparation of light-sensitive compositions, including particularly photosensitized natural and synthetic resin compositions, useful in photographic, photolithographic, and photoresist processes. The compound 4,4′-diazidobenzophenone-p-carboxyphenylhydrazone is particularly suited as a sensitizer in the preparation of photoresist compositions for the fabrication of microminiaturized semiconductor devices and integrated circuits. The compound is prepared from 4,4′-diazidobenzophenone by condensation with p-carboxyphenylhydrazine.

The invention herein described was made in the course of or under a contract or subcontract thereunder with the Department of the Air Force, Air Force Logistics Command, Wright-Patterson AFB, Ohio.

BACKGROUND

The invention relates to the photosensitization of natural and synthetic resin compositions. A novel aromatic azide sensitizer is provided having an absorbance maximum at 365 mμ. Novel azide polymers are also provided by chemically bonding the novel sensitizer directly to a resin having hydroxy groups or other active hydrogen atoms.

It is known that various aromatic azides decompose upon exposure to light of selected wavelengths to yield a structure capable of inducing further polymerization or cross-linking of a wide variety of natural and synthetic resin compositions. Thus, film-forming resin solutions photosensitized by the addition of certain aromatic azides have been found useful in a wide variety of photographic, photolithographic, and photoresist processes.

In the microelectronics industry the fabrication of semiconductor devices and integrated circuits has involved extensive use of photoresist compositions. Selective etching with the use of photoresist compositions is employed to remove selected regions of a silicon dioxide layer, for example, to prepare a silicon wafer for masked diffusion of impurities. The photoresist technique is also employed in the metallization of a semiconductor structure to provide ohmic contacts for circuit connections.

The step of applying a photoresist film to a semiconductor wafer generally involves a mounting of the wafer on a vacuum chuck followed by a dropwise addition of the liquid photoresist composition. The wafer is then rotated at about 5,000–10,000 r.p.m. for 10 seconds. The combination of surface tension and centrifugal force causes the resist to spread uniformly into a thin film from which the solvent phase quickly escapes by evaporation. The resulting photoresist film is typically about 1 micron thick.

A 1 micron photoresist film has been found adequate for most purposes. However, a trend of increasing miniaturization and the crowding of additional devices and connections on a semiconductor chip of a given size has forced the industry to search for improved resist compositions capable of permitting ever sharper resolution between adjacent surface features.

Increased resolution requires, first of all, the use of a photoresist film substantially less than 1 micron thick; and the use of thinner films requires the use of more efficient sensitizers. Moreover, it is particularly desirable that the rate of hardening or insolubilization of the resist resin be extremely sensitive to exposure time, since the unexposed areas always receive some light due to diffraction and scattering effects. If the resist composition is highly sensitive to exposure time, there will be an essentially complete insolubilization of the resin in the exposed areas, while the unexposed areas will remain completely soluble.

In order to obtain high resolution with thin films a sensitizer is required which has (1) intense absorption at the wavelengths required, (2) high "contrast," e.g. sensitivity to differences in exposure, and (3) adequate compatibility with the resin and solvent formulations used.

THE INVENTION

Accordingly, it is an object of the present invention to provide improved photosensitizers for use in the preparation of light sensitive compositions. A more specific object of the invention is to provide improved photoresist compositions for use in the fabrication of semiconductor structures and devices.

It is a further object of the invention to provide a process for the synthesis of improved photosensitizers. It is also an object of the invention to provide improved photosensitive resins prepared by chemically bonding the improved photosensitizers directly to resin molecules having hydroxyl groups or other active hydrogens.

A principal feature of the new sensitizer is the occurrence of an intense maximum in its ultraviolet absorption spectrum at 365 mμ, which coincides with the strongest peak in the emission spectrum of a mercury-vapor arc, commonly used as a source of light for photochemical reactions.

Another desirable feature of the sensitizer is its effective decomposition within extremely short exposure times, typically requiring from 1 to 5 seconds of exposure, compared with a 30-second exposure time required for many commercially available compositions.

A short exposure time is a significant advantage in and of itself. However, it is far more important, from the standpoint of providing a high degree of resolution, that the increased resistance of the resist resin to developer spray be extremely sensitive to exposure time. That is, ideally, the resist resin should convert from totally soluble to totally insoluble over the shortest possible period of elapsed exposure time. When used in a 1% concentration, for example, the sensitizer of the present invention causes very little change in resin solubility during the first second of exposure time (given light intensity), but a nearly complete insolubilization of the resin at the end of 2½ seconds exposure time. A "high contrast" resist is thereby provided since the degree of insolubilization in the unexposed areas arising from diffraction and scattering is virtually eliminated.

Among the disadvantages of prior azide sensitizers is their poor solubility in typical resin compositions, as shown by the fact that they sometimes deposit crystals upon storage below room temperature, or during the initial step of applying a liquid photoresist film. Crystals formed during film formation are obviously of serious consequence, since the resulting imperfections frequently lead to failure of the semiconductor device. Poor solubility also limits the concentration of solids which may be included in the resist composition, thereby limiting the flexibility of packaging and handling techniques.

The sensitizer of the present invention has improved solubility with respect to prior aromatic azides, due to the presence of a carboxyl group and the polar hydrazone linkage in its chemical structure.

Although its behavior in physical admixture with resin solutions has been found superior to prior aromatic azides, a further improvement in the control and reproducibility characteristics of resist compositions can be achieved by chemically linking the novel sensitizer structure with a resin having hydroxyl groups. That is, by esterification of the carboxyl group of the novel sensitizer with a polyhydroxy compound to introduce the corresponding recurring ester linkage as a structural unit of the polymer.

The sensitizers of the invention have the following structure:

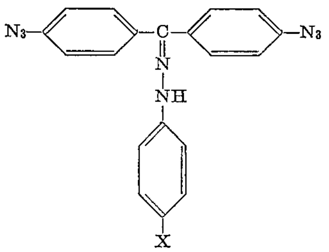

where X is selected from the group consisting of COOR, COOM, and CONRR′; R and R′ are selected from the group consisting of hydrogen and $C_1$–$C_4$ alkyl; and M is selected from the group consisting of $NH_4^+$, $Na^+$ and $K^+$.

The preferred sensitizer of the invention is 4,4′-diazidobenzophenone-p-carboxyphenylhydrazone, having the following structure:

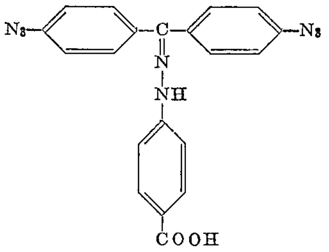

The compound is synthesized by the following steps:

(I) Azidization of 4,4′-diaminodiphenylmethane to yield 4,4′-diazidodiphenylmethane.

(II) Oxidation of 4,4′-diazidodiphenylmethane to yield 4,4′-diazidobenzophenone.

(III) Condensation of the 4,4′-diazidobenzophenone with p-carboxyphenylhydrazine to yield 4,4′-diazidobenzophenone-p-carboxyphenylhydrazone.

Step I above may be completed as follows:

(a) Add 246 grams 4,4′-diaminodiphenylmethane and 200 ml. of chloroform to a 3-liter vessel fitted with a mechanical stirrer and an ice bath;

(b) Add 900 ml. conc HCl with stirring. While keeping the temperature below 3° C.;

(c) Add dropwise, with stirring, a solution of 150 grams sodium nitrite in 240 ml. water;

(d) Add 10 grams urea and then filter;

(e) Separate and discard the chloroform layer, returning the remaining filtrate to the vessel;

(f) Add dropwise a solution of 120 grams sodium azide in 360 ml. water with continued stirring for two hours. Allow the temperature to rise to room temperature; and (g) Collect the precipitate and wash thoroughly with water.

Yield, 270 grams (87%) 4,4′-diazidodiphenylmethane, melting point 32° to 33° C.

Step II of the above procedure may be carried out as follows:

(a) Using the same equipment as above, dissolve 270 grams 4,4′-diazidodiphenylmethane in a solution consisting of 50 ml. conc sulfuric acid, 1250 ml. acetic acid, and 150 ml. water. With stirring, heat the vessel to 60° to 90° C.;

(b) Slowly add 400 grams sodium dichromate pentahydrate and reflux gently for six hours. Then allow vessel to cool and let stand for one hour;

(c) Wash well with copious quantities of water. Yield 250 grams (90%) 4,4′-diazidobenzophenone, M.P. 141–142° C.

Step III of the above procedure may be carried out as follows:

(a) Dissolve 20 grams 4,4′-diazidobenzophenone in 150 ml. chloroform;

(b) Add this to a solution of 11 grams p-carboxyphenylhydrazine dissolved in 150 ml. acetic acid;

(c) Reflux the combined solution overnight and then precipitate with 500 ml. water and allow to cool;

(d) Collect the precipitate and recrystallize from a mixture of acetone and water.

Yield, 10 grams (30%) 4,4′-diazidobenzophenone-p-carboxyphenylhydrazone, light yellow crystals turning green to black above 150° C. with decomposition and explosion if heated rapidly to 205° C. The compound is very unstable under ordinary fluorescent lights, turning yellow-brown in a few minutes.

One aspect of the invention is embodied in a photoresist composition comprising a soluble polymer, a solvent for the polymer, and 4,4′-diazidobenzophenone-p-carboxyphenylhydrazone as a photosensitizer.

Essentially any soluble organic polymer which can be rendered insoluble by further polymerization or cross-linking, using a suitable sensitizer, and which has been dissolved in a solvent system compatible with the solubility of the sensitizer of the invention, is suitable for use in preparing the photoresist compositions. Suitable polymers include the polyvinyl compounds, polyolefins, alkyd resins, cellulose and cellulose derivatives, natural and synthetic rubber latexes, and polyamines.

Suitable polyvinyl compounds include polyvinyl alcohols, polyvinyl esters, polyvinyl acids, polyvinyl halides, polyvinyl ketones, polyvinyl amides, polyvinylamines and other polyvinyl compounds well known to those skilled in the art. Specific examples include polyvinyl alcohol, polyvinyl pyyrolidone, polyacrylic acid, polyisobutylene, polystyrene, polyvinyl acetate, polyvinyl chloride, polyacrylic amide, gelatin casein, dextrin, nylon, gum arabic, and photographc glue.

Suitable alkyd resins include the Glyptals made from phthalic anhydride condensed with a polyhydric alcohol, alkyds made from reacting maleic anhydride with diethylene glycol; succinic acid with ethylene glycol, and others.

Suitable solvents for the preparation of photoresist compositions in accordance with the invention include primarily the lower alcohols and ketones. For example, methanol, ethanol, isopropanol, dimethyl ketone, methylethyl ketone, diethyl ketone, cyclohexanone, 2-butanone, and others are useful. In some instances, light hydrocarbons may be used, including pentane, hexane, benzene, toluene, xylene, etc. Mixtures of any two or more of the above may be used.

The compositions generally include from 5% to 35% by weight total solids, preferably 10% to 20%. The concentration of sensitizer, based on the total composition, lies in the range 0.5% to 10%, and preferably from 1% to 5%.

An example of the photoresist composition is formulated as follows:

Alkyd resin[1]—20 grams
Sensitizer[2]—0.4 gram
Methylethylketone—64 milliliters
Cyclohexanone—16 milliliters

[1] Phthalic anhydride—soya oil condensation product.
[2] 4,4'-diazidobenzophenone-p-carboxyphenylhydrazone.

The resist compositions of the invention, including the above example, may be used in accordance with the following suggested procedure:

A one-inch semiconductor wafer is conveniently cleaned on the spinner by applying 10 drops resist solution and spinning for 5 seconds at 8,000 r.p.m., followed by washing with trichloroethylene. The application of 10 drops resist solution and spinning at 8,000 r.p.m. for 5 seconds is then repeated. No prebake is required. The resist is then exposed through an appropriate mask for 3 to 5 seconds, using a high-pressure mercury lamp. Roughly 10–15 seconds exposure is required when using a low pressure mercury source. The exposed film is developed by spraying 30 seconds with each of xylene, isopropyl alcohol, and again with xylene. A post bake of 10 minutes at 280° C. in a nitrogen ambient is used.

The resulting film has a thickness of 1,500 to 1,700 Angstroms with a resolution of .015–1.0μ. The average pinhole count is only one to two per 40 square mils area.

We claim:

1. A compound having the following structure:

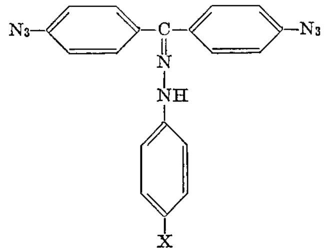

where X is selected from the group consisting of COOR, COOM, and CONRR'; R and R' are selected from the group consisting of H and $C_1$–$C_4$ alkyl; and M is selected from the group consisting of $NH_4^+$, $Na^+$, and $K^+$.

2. 4,4' - diazidobenzophenone - p - carboxyphenylhydrazone.

References Cited

UNITED STATES PATENTS

| | | | |
|---|---|---|---|
| 2,852,379 | 9/1958 | Hepher et al. ---- | 260—349 XR |
| 2,940,853 | 6/1960 | Sagura et al. ---- | 260—349 XR |

OTHER REFERENCES

Fuson: "Reactions of Organic Compounds," John Wiley & Sons, Inc., Pub., New York (1962), pp. 418–9.

JOHN D. RANDOLPH, Primary Examiner
J. M. FORD, Assistant Examiner

U.S. Cl. X.R.

96—35.1, 91; 204—159.17; 260—875